(12) United States Patent
Close

(10) Patent No.: US 6,262,633 B1
(45) Date of Patent: Jul. 17, 2001

(54) HIGH OUTPUT CURRENT OPERATIONAL AMPLIFIER OUTPUT STAGE

(75) Inventor: JoAnn P. Close, Los Altos, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/560,305

(22) Filed: Apr. 27, 2000

(51) Int. Cl.[7] ...................................................... H03F 3/26
(52) U.S. Cl. ........................... 330/267; 330/268; 330/255
(58) Field of Search ................................. 330/255, 267, 330/268

(56) References Cited

U.S. PATENT DOCUMENTS

| | | | |
|---|---|---|---|
| 4,041,407 | * | 8/1977 | Main ........................................ 330/13 |
| 6,084,475 | * | 7/2000 | Rincon-Mora ........................ 330/255 |
| 6,100,762 | * | 8/2000 | Kato ...................................... 330/255 |

OTHER PUBLICATIONS

Analog Devices AD8041 Data Sheet (1995) pp. 1–16.

* cited by examiner

Primary Examiner—Robert Pascal
Assistant Examiner—Henry Choe
(74) Attorney, Agent, or Firm—Koppel & Jacobs

(57) ABSTRACT

A rail-to-rail op amp output stage is configured to provide one or more additional base drive paths for each of its output transistors, reducing the stage's distortion and increasing its maximum output current without substantially increasing quiescent current. The additional base drive paths reduce the demand on the transistors driving the output transistors, lowering the distortion they might otherwise contribute to the output current. In a preferred embodiment, the collectors of the stage's clamp transistors are connected to the bases of their opposing output transistors, so that each clamp transistor provides an additional base drive path to a respective output transistor, thereby increasing maximum output current without substantially increasing quiescent current, and substantially reducing crossover distortion.

18 Claims, 7 Drawing Sheets

HIGH OUTPUT CURRENT OPERATIONAL AMPLIFIER OUTPUT STAGE

BACKGROUND OF THE INVENTION

1. Field of the Invention

This invention relates to the field of operational amplifier output stages, and particularly to high output current, low distortion, rail-to-rail output stages.

2. Description of the Related Art

The characteristics of an operational amplifier (op amp) are defined with various specifications. Three of these, i.e., maximum output current, quiescent current, and distortion, tend to be interrelated. For example, the quiescent current, i.e., the current drawn from the power supplies when no signal is applied to the op amp, tends to limit the maximum output current, with an increase in maximum output current requiring a corresponding increase in quiescent current. An increase in quiescent current also tends to improve the distortion performance of the op amp, though at the cost of higher power dissipation.

A known op amp output stage is shown in FIG. 1, which is a simplified schematic of the output stage of an AD8041 op amp from Analog Devices, Inc. in Norwood, Mass. A drive circuit 10 produces complementary drive signals 12 and 14 to drive a complementary pair of output transistors Q1 and Q2, respectively. Q1 and Q2 are connected in series between supply voltages VCC and VEE, with the junction of their collectors serving as the stage's output terminal OUT. Q1 and Q2 conduct respective currents $I_{Q1}$ and $I_{Q2}$ in response to drive signals 12 and 14, which are summed at the output terminal to produce an output current $I_o$.

Drive circuit 10 is arranged to receive differential inputs V+ and V−, and to produce complementary drive signals 12 and 14 in response; i.e., as drive signal 12 pulls down harder on Q1's base to increase the current $I_{Q1}$ conducted by Q1 to the output, drive signal 14 also decreases to reduce the current $I_{Q2}$ conducted by Q2. Similarly, drive circuit 10 manipulates drive signals 12 and 14 so that when $I_{Q2}$ is increased, $I_{Q1}$ is decreased.

A number of implementations can be employed to obtain the A/B-type behavior from drive circuit 10, one of which is illustrated in FIG. 1. Differential inputs V− and V+ are connected to transistors Q3 and Q4, respectively, each of which is connected as an emitter follower. V− and V+ are also connected to transistors Q5 and Q6, which are also connected as emitter followers; Q3 and Q4 are of opposite polarity to that of Q5 and Q6. A pair of transistors Q7 and Q8 are connected to receive the outputs of emitter follows Q3 and Q4, respectively, and to conduct first and second currents in response. A pair of transistors Q9 and Q10 are connected to receive the outputs of emitter follows Q5 and Q6, respectively, and to conduct third and fourth currents in response. A current mirror circuit 16 made from transistors Q11 and Q12 is connected to mirror the current conducted by Q7 to Q8, with the difference current between the mirrored current and the Q8 current being drive signal 14. Similarly, a current mirror 18 made from transistors Q13 and Q14 is connected to mirror the current conducted by Q9 to Q10, with the difference current between the mirrored current and the Q10 current being drive signal 12. The emitters of Q7 and Q9 are connected together at a junction 20 and the emitters of Q8 and Q10 are connected together at a junction 22. A compensation capacitor is connected between V− and OUT, and a resistor RI is connected between junctions 20 and 22 to improve the stage's stability. A complementary pair of clamp transistors Q15 and Q16 are biased with respective bias voltages $V_{bias1}$ and $V_{bias2}$ to prevent current mirror transistors Q14 and Q12, respectively, from saturating.

The output stage also includes a transistor Q17 connected between mirror transistor Q11 and VCC via a resistor R2, and a transistor Q18 connected between mirror transistor Q13 and VEE via a resistor R3. Q17/R2 and Q18/R3 are part of the scheme to bias output transistors Q1 and Q2 at the proper quiescent current. The collector currents of Q17 and Q18 are mirrored via Q11/Q12 and Q13/Q14, respectively, to provide known currents through Q15 and Q16. This, along with bias voltages $V_{bias1}$ and $V_{bias2}$, and the relative sizes of Q1, Q15, Q2 and Q16 set the output transistors' quiescent operating point.

In operation, when V− drops below V+, the voltages at the bases of Q7 and Q9 decrease. This results in the current through Q7 and Q10 (via R1) to be increased, and that through Q8 and Q9 to decrease. The Q10 current is greater than the mirrored Q9 current, and the resulting difference current (drive signal 12) pulls down on the base of output transistor Q1, increasing the current IQ. provided to the output terminal. At the same time, the mirrored Q7 current is greater than the Q8 current, and the resulting difference current (drive signal 14) reduces the drive to Q2, and thereby reduced $I_{Q2}$. With $IQ_1$ increased and $I_{Q2}$ decreased, the net output current $I_{out}$ is increased.

Similarly, when V+ falls below V−, more current flows through the Q9/R1/Q8 path, and less flows through the Q10/R1/Q7 path, increasing the drive to output transistor Q2 and reducing it to Q1, producing a net reduction in $I_o$.

The maximum amount of current from Q1 is limited by the amount of current conducted by Q10, which is in turn limited by the current sources I4 and I1 connected in series with follower transistors Q3 and Q6. Specifically, the maximum current from Q1 is given by the lesser of 1)$\beta_{Q1}*\beta_{Q10}*$I4 and 2)$\beta_{Q1}*\beta_{Q7}*$I1. Similarly, Q2 is limited by the amount of current conducted by Q8, which is limited by the current sources I2 and I3 connected in series with follower transistors Q4 and Q5, with the maximum current from Q2 given by the lesser of 1)$\beta_{Q2}*\beta_{Q9}*$I3 and 2)$\beta_{Q2}*\beta_{Q8}*$I2. Thus, the stage's quiescent current depends on the magnitudes of the I1–I4 currents, along with the relative sizes of several of the transistor' emitters. Increasing I1–I4 increases the maximum value of $I_o$, though doing so also increases the stage's quiescent current and power dissipation.

The stage's quiescent current also affects its distortion performance. Some nonlinearity is introduced into the output by the driver stage, primarily due to the behavior of transistors Q7–Q10 as they act to sink and source the required base currents needed by the output transistors. The magnitude of the nonlinearity is directly related to the percentage change of the currents through Q7–Q10. Increasing the stage's quiescent current lowers this percentage change, which reduces the nonlinearity and thus improves the distortion performance. However, as noted above, increasing quiescent current causes a corresponding and often undesirable increase in power dissipation.

SUMMARY OF THE INVENTION

An op amp output stage is presented which, when compared with prior art output stages, provides lower distortion and up to twice as much output current for the same quiescent current. Alternatively, the new stage provides an output current equivalent to that of a prior art amplifier while reducing quiescent current by up to half.

This improved performance is accomplished by providing one or more additional base drive paths for each of the output transistors of an output stage that otherwise resembles the circuit depicted in FIG. 1. Several means are described by which this is done. For example, a pair of transistors can be employed to mirror components of the output transistors' drive signals back to their respective output transistors, thereby providing an additional base drive path to each. The additional base drive reduces the demand on the drive signal transistors (Q7–Q10), which lowers the distortion they might otherwise contribute. Alternatively, the collectors of the clamp transistors are connected to the bases of their opposing output transistors, rather than to the supply voltages as in FIG. 1; when so arranged, each clamp transistor provides an additional base drive path to a respective one of the output transistors. Another alternative combines both of these methods to provide multiple additional base drive paths for the output transistors. All of these techniques reduce the demands on the drive circuit transistors by half or more for a given output current, which decreases the distortion contribution of the output stage when the amplifier is driving a heavy current load.

Further features and advantages of the invention will be apparent to those skilled in the art from the following detailed description, taken together with the accompanying drawings.

DETAILED DESCRIPTION OF THE INVENTION

Figure 1:
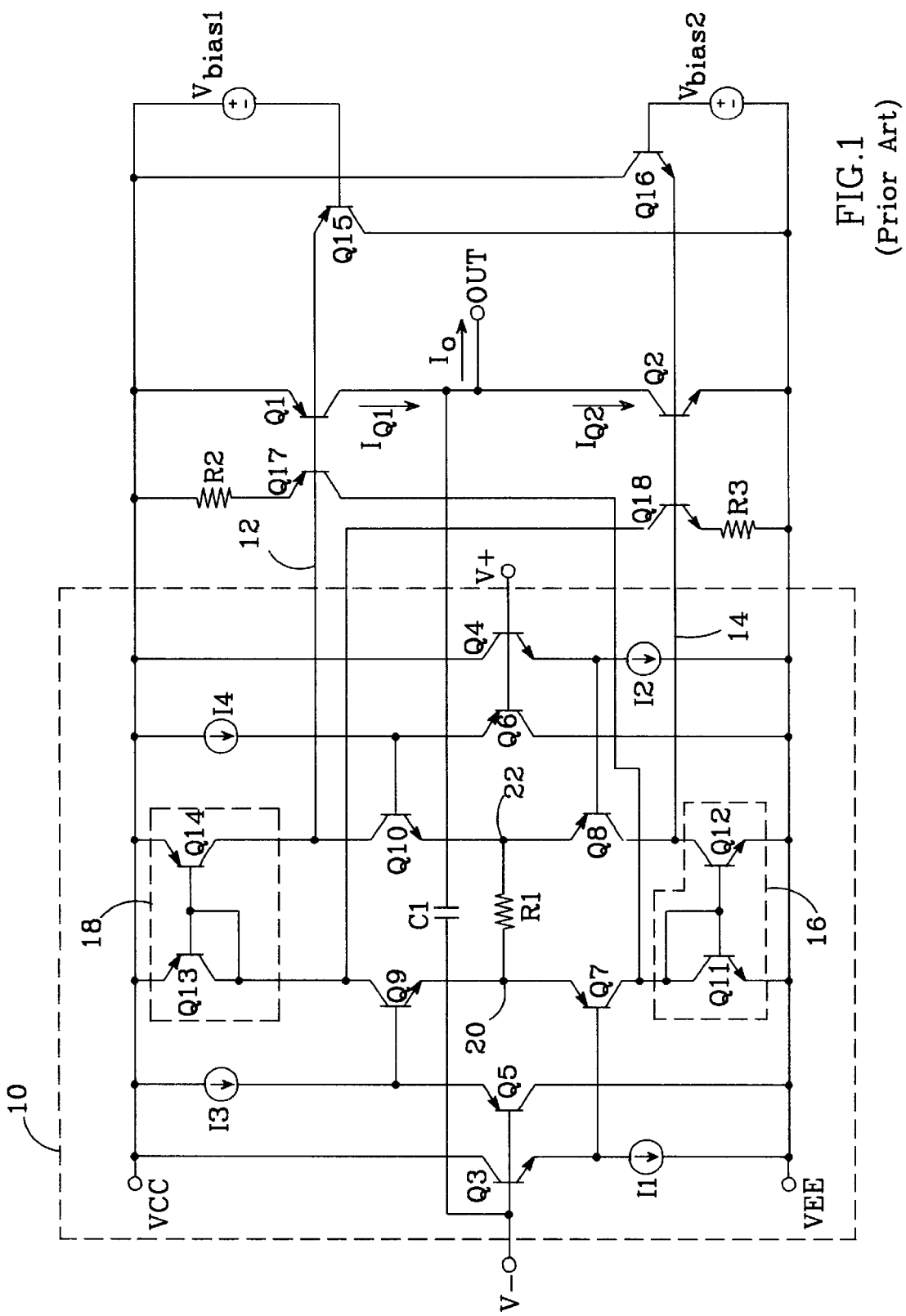
FIG. 1 is a schematic diagram of a known op amp output stage.
Figure 2A:
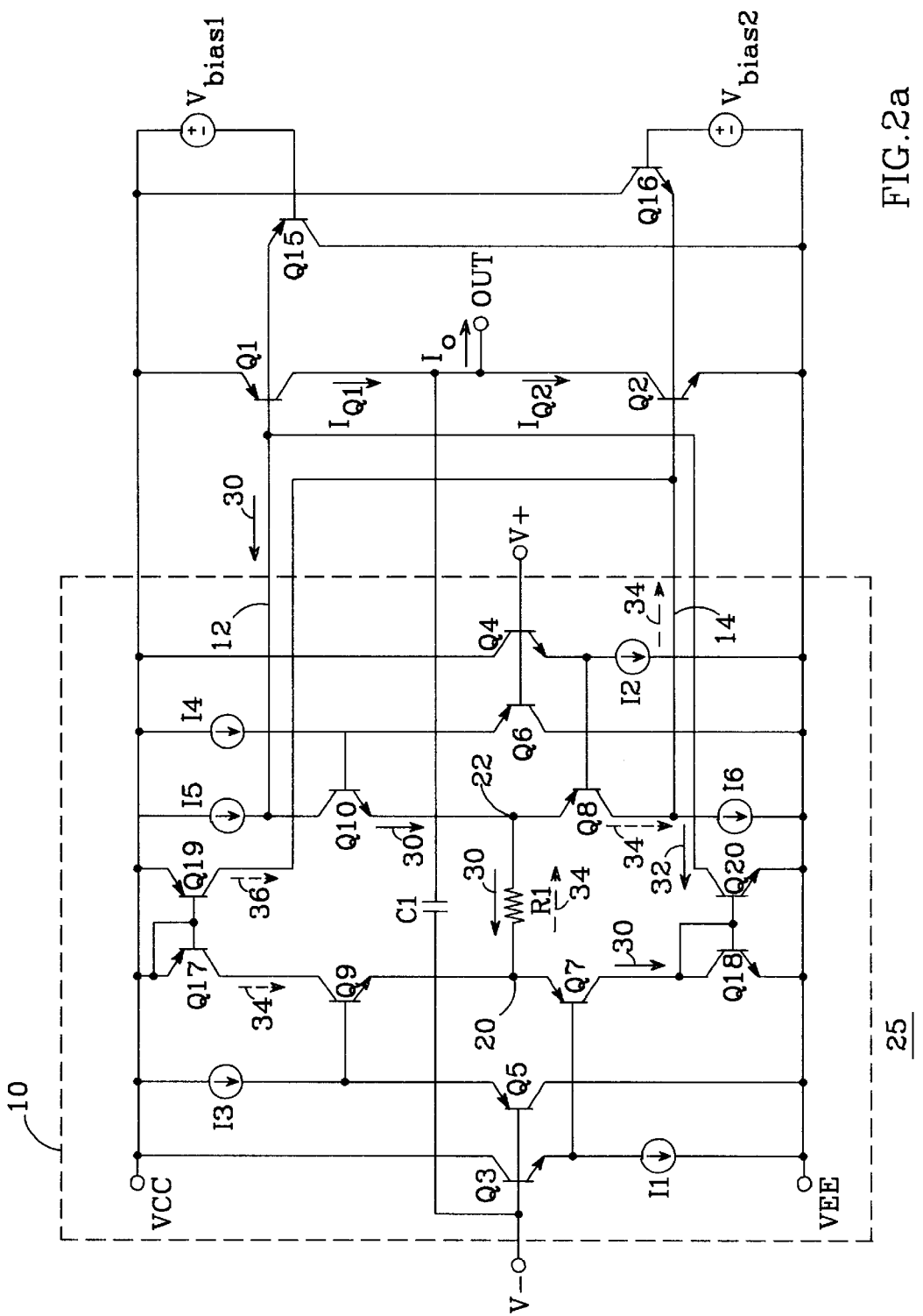
FIG. 2a is a schematic diagram of an operational amplifier output stage per the present invention.

An op amp output stage 25 in accordance with the present invention is shown in FIG. 2a. As in FIG. 1, the output stage includes a complementary pair of bipolar output transistors Q1 and Q2 connected in series between first and second supply voltages VCC and VEE. The collectors of Q1 and Q2 are connected together at an output terminal OUT; Q1 conducts a current $I_{Q1}$ and Q2 conducts a current $I_{Q2}$, which are summed at the output terminal to produce the output stage's output current $I_o (= I_{Q1} - I_{Q2})$ Output transistors Q1 and Q2 are driven by complementary drive signals 12 and 14, respectively, which are provided by drive circuit 10. As noted above, drive signals 12 and 14 are "complementary" with respect to the effect they have on the output transistors, such that when Q1 is driven to increase $I_{Q1}$, Q2 is driven to reduce $I_{Q2}$, and vice versa.

The output stage is configured to include a pair of transistors (discussed below) which mirror components of drive signals 12 and 14 back to the bases of their respective output transistors, thereby providing additional base drive to Q1 and Q2. This is illustrated by reference to the exemplary implementation of drive circuit 10 shown in FIG. 2a. Here, rather than connect current mirrors between Q7 and Q8 and between Q9 and Q10 (as in FIG. 1), diode-connected transistors Q17 and Q18 are connected between VCC and Q9, and between VEE and Q7, respectively; in addition, a first current source I5 is connected to the collector of Q10, and a second current source is connected to the collector of Q8.

As in FIG. 1, the output stage also includes a complementary pair of clamp transistors Q15 and Q16, with Q15 connected between the base of Q1 and VEE and Q16 connected between the base of Q2 and VCC. Q15 and Q16 are biased with respective voltage bias sources $V_{bias1}$ and $V_{bias2}$ to ensure that Q1 and Q2 are never completely cut off; Q15 and Q16 are also part of the scheme to set the quiescent current of output transistors Q1 and Q2, as noted above.

A pair of transistors Q19 and Q20 are added to the output stage to provide additional base drive paths for output transistors Q1 and Q2. Q19 is connected in a mirror configuration with diode-connected transistor Q17, with its collector connected to the base of Q2. Similarly, Q20 is connected in a mirror configuration with diode-connected transistor Q18, with its collector connected to the base of Q1. When connected in this way, Q19 mirrors the Q9/R1/Q8 current component of drive signal 14 to the base of Q2, and Q20 mirrors the Q10/R1/Q7 current component of drive signal 12 to the base of Q1.

In operation, a differential voltage is applied across the drive circuit's input terminals V+ and V−. When V− falls below V+, current flows via the Q10/R1/Q7 current path. The difference between the current from I5 and the Q10 current form a difference current (drive signal 12), which pulls down on the base of Q1 and increases $I_{Q1}$. An increased current in the Q10/R1/Q7 current path results in a decrease in current in the Q9/R1/Q8 current path, with the difference between the I6 current and the Q8 current providing a difference current (drive signal 14) which reduces the voltage at the base of Q2 and reduces $I_{Q2}$. Simultaneously, the Q10/R1/Q7 current is mirrored to the base of Q1 via Q20 (arrows 32), so that Q1's base is pulled down even harder to increase the $I_{Q1}$ current. The increase in $I_{Q1}$ combined with the decrease in $I_{Q2}$ results in a net increase in $I_o$.

Similarly, when V− rises above V+, drive signal 14 increases the voltage at the base of Q2 via the Q9/R1/Q8 current path, increasing $I_{Q2}$. The increased Q9/R1/Q8 current results in a reduction in the Q10/R1/Q7 current, with the difference between the I5 current and the Q10 current providing a difference current (drive signal 12) which reduces the downward pull on the base of Q1 and thereby reduces $I_{Q1}$. Similarly, when V− is greater than V+, the Q9/R1/Q8 current (arrows 34) is mirrored to the base of Q2 via Q19 (arrows 36), which serves to increase $I_{Q2}$. The increase in $I_{Q2}$ combined with the decrease in $I_{Q1}$ results in a net decrease in $I_o$.

The additional base drive currents provided by Q19 and Q20 serve to offload the demands on drive circuit transistors Q7–Q10. As noted above, the output stage's output current is limited by the magnitude of the output transistors' respective base drives. In the prior art, all of the base drive was necessarily produced by drive circuit 10, with Q1's base drive conducted through Q10 and Q7. The magnitude of Q1's base drive was in turn dependent on the base currents of Q10 and Q7, which were received from current sources I4 and I1, respectively. In this way, the magnitude of the currents provided by I4 and I1 determined the maximum current from Q1. Similarly, the magnitude of the current provided by current sources I3 and I2 determined the maximum current through Q2. As such, maximum output current could only be increased by increasing I1–I4; however, this increases the stage's quiescent current and power dissipation. With the addition of Q19 and Q20, the currents required from Q7–Q10 for a given output current are reduced, lowering the distortion these transistors would otherwise introduce. Alternatively, Q19 and Q20 permit the maximum output current from the output stage to be increased, without a corresponding increase in distortion from the drive signal transistors. Using Q19 and Q20 to increase output current will necessarily result in an increase in quiescent current, however.

Figure 2B:
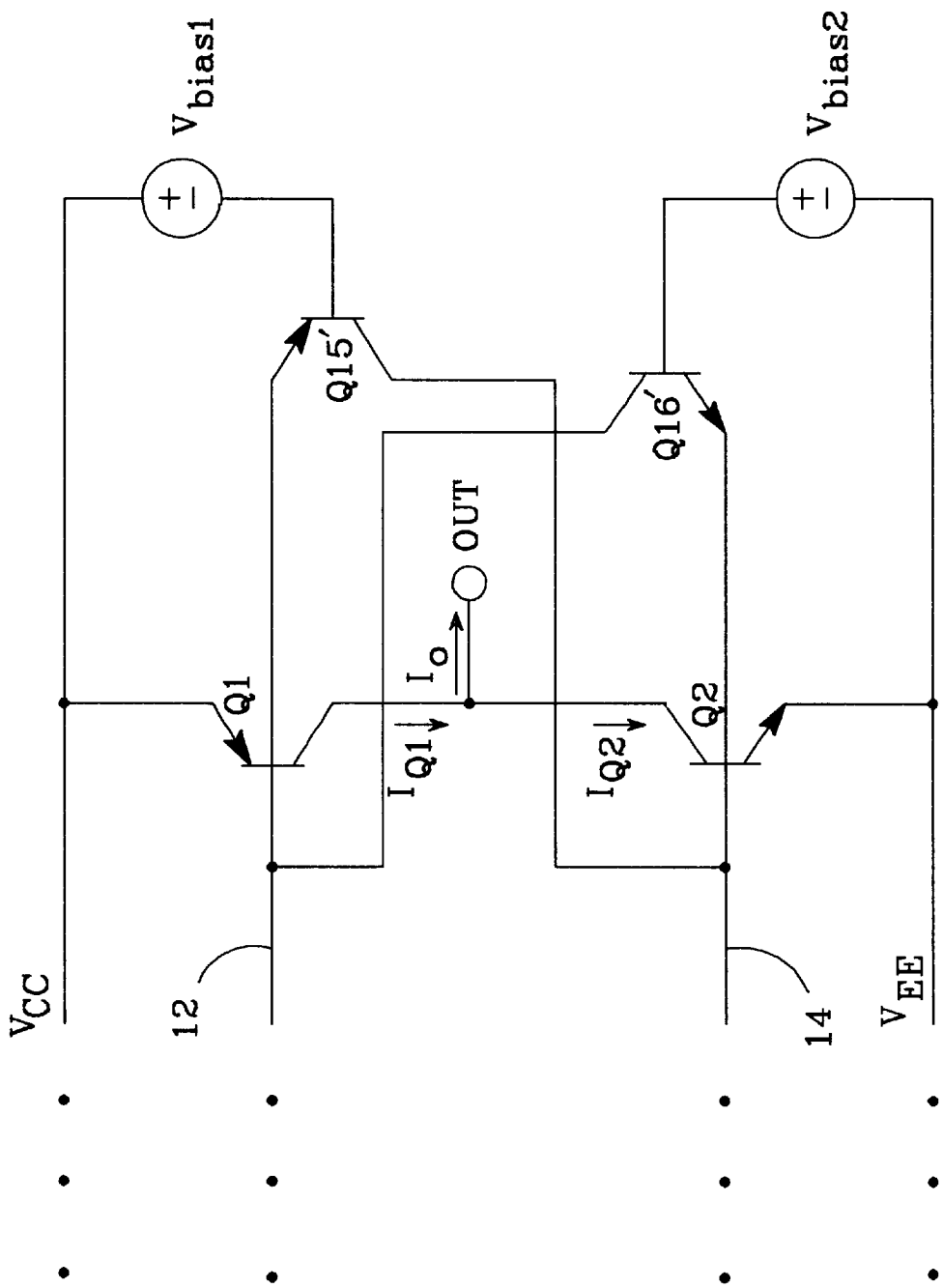
FIG. 2b is an alternative embodiment of the operational amplifier output stage of FIG. 2a, with the output stage's clamp transistors connected to provide additional base drive paths to the output transistors.

Even more benefits are realized when the output stage's clamp transistors are connected as shown in FIG. 2b, which depicts only a portion of the output stage; the portion not shown is the same as in FIG. 2a. Here, rather than connect each clamp transistor between the base of an output transistor and a respective supply voltage (as in FIG. 1), they are connected between the bases of the two output transistors. Thus, the collector of clamp transistor Q15 is moved from VEE to the base of Q2 (with Q15 now being labeled Q15'), and the collector of clamp transistor Q16 is moved from VCC to the base of Q1 (and becomes Q16'). In the prior art, the main task of the clamp transistors is to keep mirror transistors Q12 and Q14 out of saturation (if drive circuit 10 is configured per FIG. 1), and/or to keep the output transistors from being completely cut off (if configured per FIG. 2a). When connected as shown in FIG. 2b, however, clamp transistors Q15' and Q16' still provide the clamping functions, and also provide some additional base drive to the output transistors; i.e., Q15' provides an additional base drive path for Q2, and Q16' does the same for Q1. These additional base drive paths also serve to greatly decrease the output stage's crossover distortion.

Q15' and Q16' operate as follows: as has been previously described, drive signals 12 and 14 are complementary; i.e., when drive signal 12 acts to increase $I_{Q1}$ (by reducing the voltage at the base of Q1), drive signal 14 acts to reduce $I_{Q2}$ (by reducing the voltage at the base of Q2). Assume that V– is less than V+, so that drive signal 12 pulls down on Q1's base, and drive signal 14 decreases the voltage on Q2's base. The base of Q16' is at a fixed voltage set by $V_{bias1}$. Thus, the lower Q2 base voltage (and Q16' emitter voltage) increases the base-emitter voltage of Q16', causing the current it conducts to be increased. With its collector connected to the base of Q1, Q16' pulls its additional current from the base of Q1, further increasing $I_{Q1}$. Similarly, when V– is greater than V+, the base voltages of Q1 and Q2 increase. The increased voltage at the base of Q1 (and at the emitter of Q15') acts to increase the base-emitter voltage of Q15', so that it conducts more current to the base of Q2 and thereby further increases $I_{Q2}$.

As noted above, connecting clamp transistors Q15' and Q16' as shown in FIG. 2b lowers distortion by offloading drive circuit transistors Q7–Q10. However, this configuration of the clamp transistors provides additional improvements in distortion performance as follows: when the component currents making up an output transistor's base drive—i.e., Q1's base current, the emitter current of Q15', and the collector current of Q16' (for Q1); Q2's base current, the emitter current of Q16', and the collector current of Q15' (for Q2)—are added together, they cancel each other so as to virtually eliminate crossover distortion.

Figure 3A:
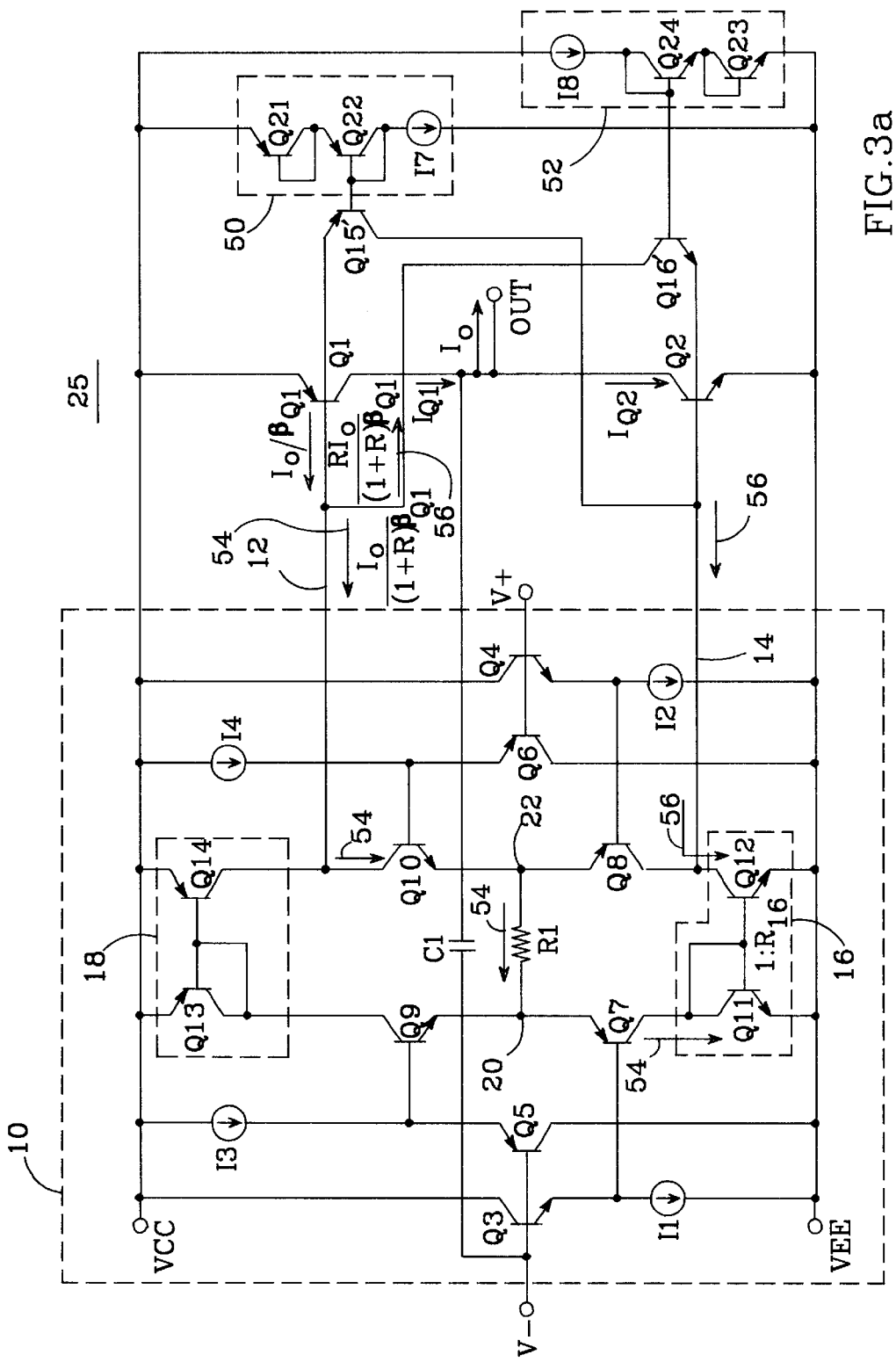
FIG. 3a is a schematic diagram of the preferred embodiment of an operational amplifier output stage per the present invention, which depicts the operation of an additional base drive path for one of the output transistors.
Figure 3B:
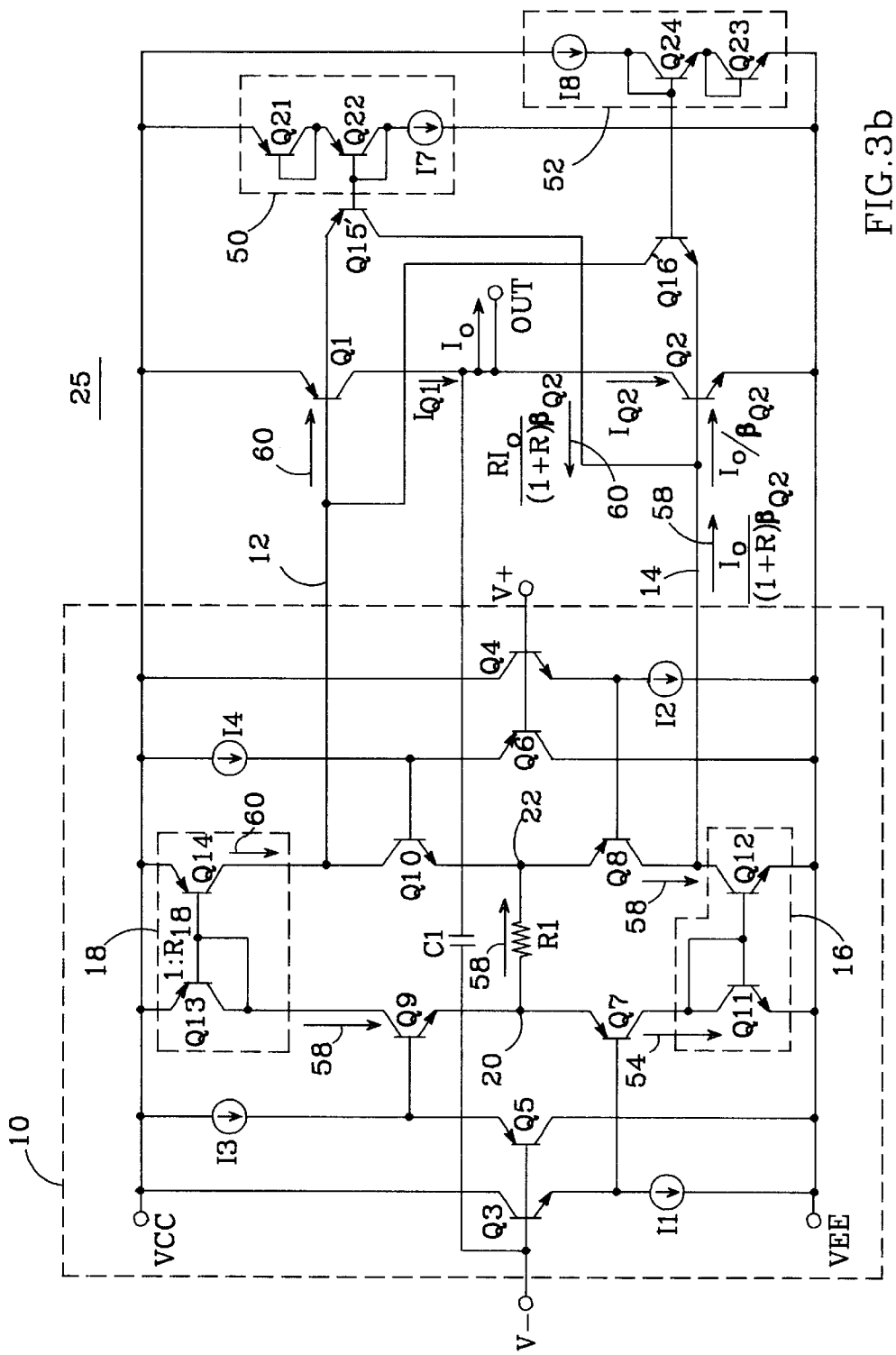
FIG. 3b is a schematic diagram of the preferred embodiment of an operational amplifier output stage per the present invention, which depicts the operation of an additional base drive path for the other output transistor.

A preferred implementation of the invention is shown in FIGS. 3a and 3b, in which the only additional base drive paths are those provided by the clamp transistor connection scheme of FIG. 2b. Drive circuit 10 is as it was in FIG. 1, with current mirror 16 connected to mirror the Q7 current to Q8, with the difference between the mirrored current and the Q8 current generating a difference current (drive signal 14) which is delivered to the base of Q2. Similarly, current mirror 18 mirrors the Q9 current to Q10, with the difference between the mirrored current and the Q10 current generating a difference current (drive signal 12) which is delivered to the base of Q1. Clamp transistors Q15' and Q16' are connected as in FIG. 2b, with Q15' providing an additional base drive path for output transistor Q2, and Q16' doing the same for Q1.

As connected in FIG. 3a, clamp transistors Q15' and Q16' keep Q14 and Q12 out of saturation. The emitter of Q15' is connected to the collector of mirror transistor Q14, and its base is connected to a bias voltage source 50. The output of bias voltage source 50 is set so that Q15' prevents the voltage at the collector of Q14 from getting any higher than one base-emitter voltage ($V_{be}$) below VCC. This is easily accomplished with a pair of diode-connected transistors Q21 and Q22 connected in series and biased with a current source I7. This arrangement makes the voltage at the base of Q15' two $V_{be}$'s below VCC. With the voltage at the emitter of Q15' one $V_{be}$ higher than that at its base, the collector of Q14 is kept one $V_{be}$ below VCC. This is sufficient to keep Q14 from saturating, which, if not prevented, could introduce a considerable amount of distortion into the output current.

Q16' is connected in a similar fashion. A bias voltage source 52, suitably implemented with a pair of diode-connected transistors Q23 and Q24 connected in series with a current source I8, places a voltage on the base of Q16' which prevents the collector of Q12 from getting any lower than one $V_{be}$ from VEE. This is sufficient to keep Q12 out of saturation, and thus prevents the occurrence of distortion that might otherwise be introduced into the output current.

Using diodes (diode-connected transistors Q21–Q24) and fixed current sources (I7, I8) to establish the outputs for bias voltage sources 50 and 52 results in particularly well-controlled quiescent currents in output transistors Q1 and Q2 (i.e., temperature and process insensitive).

As noted above, the novel way in which clamp transistors Q15' and Q16' are connected enable them to provide additional base drive paths for the output transistors. The use of clamp transistor Q16' to provide an additional base drive path for output transistor Q1 is illustrated in FIG. 3a. Assume that V– is less than V+. This condition was previously determined to cause drive signal 12 to pull down on output transistor Q1 via the current path formed by Q10, R1 and Q7—as indicated by arrows 54. This current is reflected by current mirror 16 to Q8 to create drive signal 14. Because the mirrored current is greater than the small current conducted by Q8, the voltage at the base of output transistor Q2 falls, reducing $I_{Q2}$. However, the lowered voltage at the base of Q2 is also connected to the emitter of clamp transistor Q16'. The base voltage of Q16' is fixed by bias voltage source 52; thus, lowering the emitter voltage of Q16' increases its base-emitter voltage, thereby increasing the amount of current conducted by Q16'. With the collector of Q16' connected to the base of Q1, the increased current through Q16' serves to significantly increase Q1's base drive. In this way, clamp transistor Q16' provides an additional base drive path (as indicated by arrows 56) for Q1.

When V− is greater than V+, clamp transistor Q15' provides additional base drive for Q2, as illustrated in FIG. 3b. As described above, when V− is greater than V+, output transistor Q2 is driven, via Q9, R1 and Q8 (arrows 58), to increase $I_{Q2}$ This drive current is mirrored by current mirror 18 to Q10. Because the mirrored current is greater than the small current through Q10, the difference current (drive signal 12) increases the voltage at the base of Q1, thereby reducing $I_{Q1}$. However, the emitter of Q15' is also connected to the base of Q1, so that Q1's increased base voltage also increases the base-emitter voltage of Q15'. The resulting increase in the current conducted by Q15' is fed to the base of Q2, significantly increasing its base drive. Thus, Q15' provides an additional base drive path (as indicated by arrows 60) for Q2.

The embodiment shown in FIGS. 3a and 3b is preferred because it provides an increase in maximum output current with only a nominal increase in quiescent current, lowers distortion by offloading drive circuit transistors Q7–Q10 and by canceling crossover distortion, and requires no more components than did the prior art. That is, all the above benefits are achieved using the same number of transistors as were used in FIG. 1.

As illustrated in FIG. 3a, the magnitude of Q1's base drive current is equal to the sum of the current 54 flowing through the Q10/R1/Q7 current path, given by $I_o/[(1+R_{16})\beta_{Q1}]$, and the current 56 flowing through the Q16'/Q12 current path, given by $(R_{16}*I_o)/[(1+R_{16})\beta_{Q1}]$, where $I_o$ is the output current, $\beta_{Q1}$ is Q1's beta, and $R_{16}$ is the current mirror ratio for mirror 16. For example, if the ratio between Q11 and Q12 is 1:1, Q1's base drive is split 50/50. However, if the ratio between Q11 and Q12 bis 1:2 (and Q13/Q14 remains 1:1), then the Q10/R1/Q7 current path contributes ⅓ of the base drive, and the Q16'/Q12 path contributes ⅔ of the base drive.

The components of Q2's base drive current are illustrated in FIG. 3b. As shown, Q2's base drive is equal to the sum of the current 58 flowing through the Q9/R1/Q8 current path, given by $I_o/[(1+R_{18})\beta_{Q2}]$, and the current 60 flowing through the Q15'/Q14 current path, given by $(R_{18}*I_o)/[(1+R_{18})\beta_{Q2}]$, where $\beta_{Q2}$ is Q2's beta, $I_o$ is as defined above, and R18 is the current mirror ratio for mirror 18.

To ensure that Q1 and Q2 receive well-controlled quiescent currents, drive circuit 10 is preferably arranged so that both Q14/Q10 and Q8/Q12 produce known difference currents such that, when V+=V−, the current in Q12 ($I_{Q12}$) is greater than $I_{Q8}$ and $I_{Q14}$ is greater than $I_{Q10}$ If not so arranged, the collector currents of Q15' and Q16' can go towards zero, resulting in large and poorly-controlled quiescent currents in Q1 and Q2. Ensuring the presence of difference currents can be accomplished by, for example, using current mirrors having ratios higher than 1:1, as discussed above.

As noted above, bias voltage sources 50 and 52 are arranged to keep Q14 and Q12 out of saturation. To ensure that this is accomplished, current sources I7 and I8 must be properly sized. When mirror transistor Q12 demands more current than Q8 can provide, the remainder is taken up by Q16'. If the current from I8 is too small, all of I8's current will be stolen by the base of Q16' when Q16' needs to absorb a lot of current, causing the voltage at the base of Q16' to drop. This in turn causes the collector voltage of Q12 to drop, which may cause it to saturate. I8 should thus be arranged to produce current sufficient to keep Q12 out of saturation even when Q16' must absorb the maximum expected Q8/Q12 difference current. Similarly, I7 must be sized to keep Q14 out of saturation even when Q15' must absorb the maximum expected Q14/Q10 difference current. With these I7 and I8 limitations taken into account, the maximum output current $I_o$(max.) of an output stage configured as shown in FIGS. 3a and 3b when V− is smaller than V+ (output transistor Q1 dominant) is determined by the smaller of:

1) $I1*\beta_{Q7}*\beta_{Q1}*(1+R_{16})$
2) $I4*\beta_{Q10}*\beta_{Q1}*(1+R_{16})$, or
3) $I8*\beta_{Q16'}*\beta_{Q1}*[(1+R_{16})/R_{16}]$.

Similarly, when V− is greater than V− (output transistor Q2 dominant), the maximum output current is given by the smaller of:

1) $I3*\beta_{Q9}*\beta_{Q2}*(1+R_{18})$,
2) $I2*\beta_{Q8}*\beta_{Q2}*(1+R_{18})$, or
3) $I7*\beta_{Q15'}*\beta_{Q2}*[(1+R_{18})/R_{18}]$ where I1–I4–I7 and I8 are the output currents of their respective current sources, $\beta_x$ is the beta value of the subscripted transistor, and $R_{16}$ and $R_{18}$ are the current mirror ratios of mirrors 16 and 18, respectively.

Figure 4A:
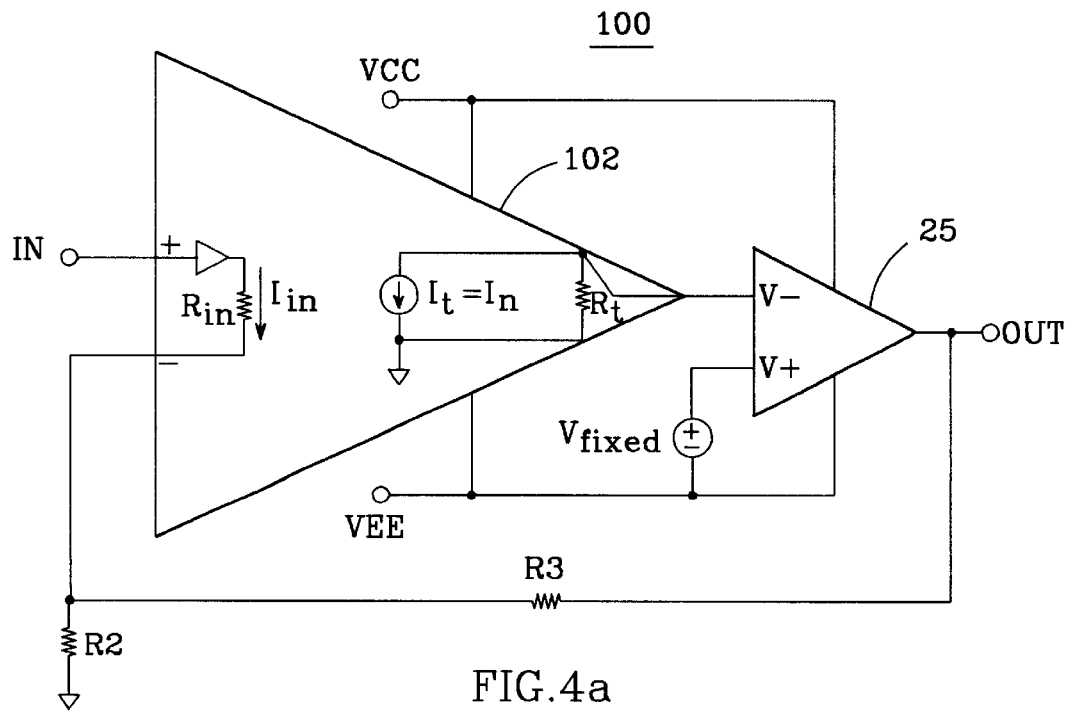
FIG. 4a is a block diagram of a current feedback amplifier employing an output stage per the present invention.
Figure 4B:
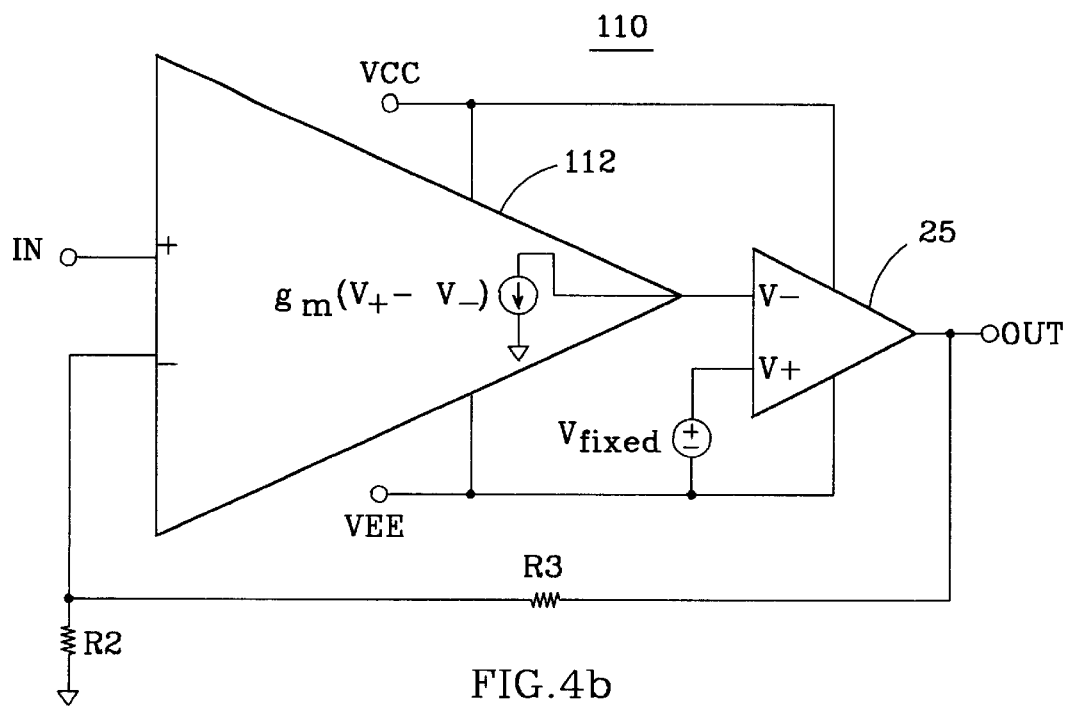
FIG. 4b is a block diagram of a voltage feedback amplifier employing an output stage per the present invention.

The novel output stage can be combined with an input stage to form either a current feedback amplifier or a voltage feedback amplifier; examples of each are shown in FIGS. 4a and 4b, respectively. In FIG. 4a, current feedback amplifier 100 comprises an input stage 102 connected to drive output stage 25, with the overall output OUT fed back to the input stage via feedback resistors R2 and R3. In FIG. 4b, voltage feedback amplifier 110 has an input stage 112 connected to drive output stage 25, with feedback via R2 and R3. In each case, the amplifier's gain G is determined by the value of its feedback resistors, as given by: G=(R2+R3)/R2. The output stage can be driven differentially, or, as shown in FIGS. 4a and 4b, with a single-ended input (with the other input of output stage 25 connected to a fixed voltage $V_{fixed}$), with the same benefits provided in either case.

Figure 5A:
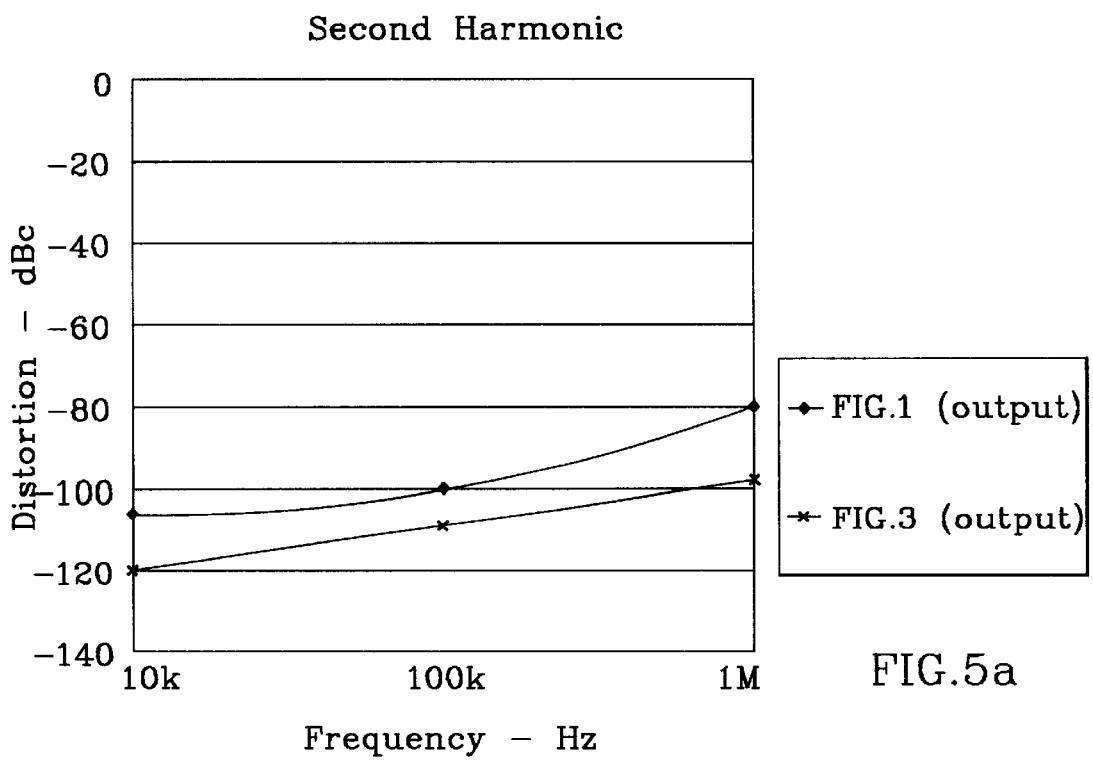
FIG. 5a is a simulated graph of second harmonic distortion versus frequency for an amplifier comprising a current feedback input stage and a prior art output stage, and an amplifier comprising the same current feedback input stage and an output stage per the present invention.
Figure 5B:
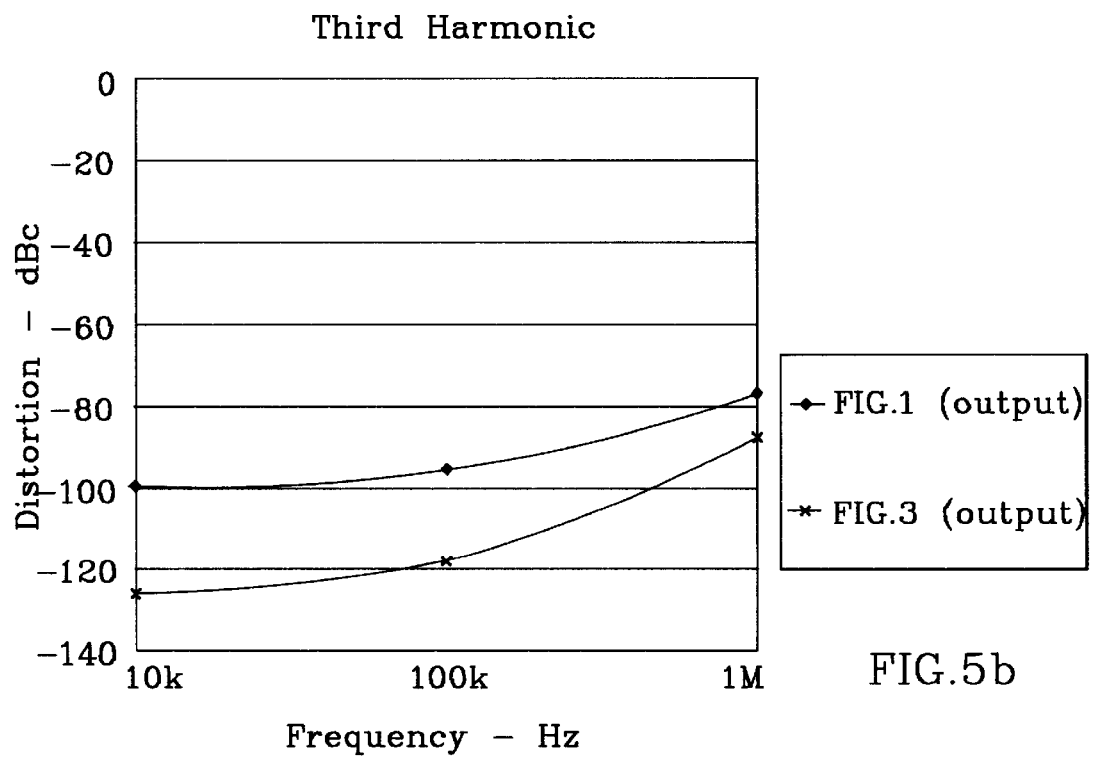
FIG. 5b is a simulated graph of third harmonic distortion versus frequency for an amplifier comprising a current feedback input stage and a prior art output stage, and an amplifier comprising the same current feedback input stage and an output stage per the present invention.

As noted above, the invention improves both the output current and distortion performance of an op amp output stage. The improvement in distortion performance afforded by the present invention is illustrated in FIGS. 5a and 5b, which are simulated plots of second and third harmonic distortion, respectively, versus frequency for both an amplifier made from a current feedback input stage and an output stage configured per FIG. 1, and an amplifier made from the same current feedback input stage and an output stage configured per FIGS. 3a and 3b. For each graph, the amplifier: has a gain of +2; is powered with ±2.5 volt supplies with $V_{fixed}$ set to a fixed voltage of 2.5 volts; receives a sinusoidal input voltage sweeping between −1 volt and +1 volt connected to the amplifier input IN; and drives a load resistance of 25 ohms. In both graphs, the output stage current mirrors 16 and 18 are arranged with ratios of 1:2. As is clearly evident, the invention reduces distortion over a wide range of frequencies.

While particular embodiments of the invention have been shown and described, numerous variations and alternate embodiments will occur to those skilled in the art. Accordingly, it is intended that the invention be limited only in terms of the appended claims.

I claim:

1. An operational amplifier output stage, comprising:
complementary bipolar output transistors, the collector-emitter circuits of which are connected in series between a first supply voltage and a second supply voltage, the junction between said collector-emitter circuits being said output stage's output terminal, said output transistors connected to conduct respective currents in response to complementary drive signals with the difference current between said respective currents delivered to said output terminal as said output stage's output current,
a drive circuit connected to provide said complementary drive signals to the bases of said output transistors, said drive circuit arranged to receive an output stage input signal at an output stage input and to conduct components of said complementary drive signals through first and second current paths, the magnitude of said complementary drive signals varying with said output stage input signal, said drive circuit having a given quiescent current which limits the maximum amplitude of said drive signals,
first and second complementary bipolar clamp transistors biased with respective bias voltages, said clamp transistors connected to the bases of respective output transistors to set the quiescent current of said output transistors and to prevent said output transistors from being cut off, and
first and second transistors connected to mirror the currents in said first and second current paths, the collectors of said first and second transistors connected to the bases of their opposing output transistors such that each provides an additional base drive path for its output transistor, said additional base drive paths reducing the amplitudes of the drive signals needed from said drive circuit for a given output current and thereby decreasing the amount of distortion that would otherwise be introduced into said output current by said drive circuit.

2. The output stage of claim 1, wherein the collector-emitter circuits of said clamp transistors are connected between the bases of said output transistors such that each provides an additional base drive path for the output transistor to which its collector is connected, said additional base drive paths via said clamp transistors reducing crossover distortion and further reducing the amplitudes of the drive signals needed from said drive circuit for a given output current and thereby increasing the maximum output current available from said output stage for said given quiescent current.

3. The output stage of claim 1, further comprising an input stage having at least one input and providing said output stage input signal to said output stage input, said output stage input signal varying with said at least one input, said input stage and said output stage forming an operational amplifier.

4. The output stage of claim 3, wherein said output stage input is a differential input and said output stage input signal is a differential voltage.

5. The output stage of claim 3, wherein said output stage input is a single-ended input and said output stage input signal is a single-ended voltage.

6. The output stage of claim 3, wherein said operational amplifier is a current feedback amplifier.

7. The output stage of claim 3, wherein said operational amplifier is a voltage feedback amplifier.

8. An operational amplifier output stage, comprising:
complementary bipolar output transistors, the collector-emitter circuits of which are connected in series between a first supply voltage and a second supply voltage, the junction between said collector-emitter circuits being said output stage's output terminal, said output transistors connected to conduct respective currents in response to complementary drive signals with the difference current between said respective currents delivered to said output terminal as said output stage's output current,
a drive circuit connected to provide said complementary drive signals to the bases of said output transistors, said drive circuit having a given quiescent current which limits the maximum amplitude of said drive signals, and
complementary bipolar clamp transistors biased with respective bias voltages, the collectors of said clamp transistors connected to the bases of their opposing output transistors such that each provides an additional base drive path for the output transistor to which its collector is connected, said additional base drive paths reducing the amplitudes of the drive signals needed from said drive circuit for a given output current and thereby increasing the maximum output current available from said output stage for said given quiescent current.

9. The output stage of claim 8, wherein said drive circuit comprises:
first and second inputs connected to receive a differential voltage,
first and second transistors connected as emitter followers, the bases of which are connected to respective ones of said first and second inputs,
third and fourth transistors connected as emitter followers, the bases of which are connected to said first and second inputs, respectively, the polarities of said third and fourth transistors being complementary to those of said first and second transistors,
fifth and sixth transistors connected to receive the outputs of said first and second emitter followers, respectively, and to conduct first and second currents in response, the polarities of said fifth and sixth transistors being complementary to those of said first and second transistors,
a first diode-connected transistor connected to conduct said first current,
a first current source connected in series with said sixth transistor, the difference current between the output of said first current source and said second current being one of said complementary drive signals,
seventh and eighth transistors connected to receive the outputs of said third and fourth emitter followers, respectively, and to conduct third and fourth currents in response, the polarities of said seventh and eighth transistors being complementary to those of said third and fourth transistors,
a second diode-connected transistor connected to conduct said third current,
a second current source connected in series with said eighth transistor, the difference current between the output of said second current source and said fourth current being the other of said complementary drive signals,
the collector-emitter circuits of said fifth and seventh transistors connected in series between said first and second diode-connected transistors and the collector-emitter circuits of said sixth and eighth transistors connected in series between said first and second current sources, a resistor connected between the junction of said fifth and seventh transistors and the junction of said sixth and eighth transistors, and ninth and tenth transistors connected in mirror configurations with said first and second diode-connected transistors, respectively, and to said output transistors to mirror said first and third currents to the bases of respective output transistors such that each provides an additional base drive path for the output transistor to which it is connected, said additional base drive paths reducing the amplitudes of the drive signals needed from said drive circuit for a given output current and thereby decreasing the amount of distortion that would otherwise be introduced into said output current by said drive circuit.

10. The output stage of claim 8, wherein said drive circuit comprises:

first and second inputs connected to receive a differential voltage, first and second transistors connected as emitter followers, the bases of which are connected to respective ones of said first and second inputs, third and fourth transistors connected as emitter followers, the bases of which are connected to said first and second inputs, respectively, the polarities of said third and fourth transistors being complementary to those of said first and second transistors, fifth and sixth transistors connected to receive the outputs of said first and second emitter followers, respectively, and to conduct first and second currents in response, the polarities of said fifth and sixth transistors being complementary to those of said first and second transistors, a first current mirror having an input and an output, said first current mirror connected to mirror said first current to said sixth transistor, the difference current between said mirrored first current and said second current being one of said complementary drive signals, seventh and eighth transistors connected to receive the outputs of said third and fourth emitter followers, respectively, and to conduct third and fourth currents in response, the polarities of said seventh and eighth transistors being complementary to those of said third and fourth transistors, a second current mirror having an input and an output, said second current mirror connected to mirror said third current to said eighth transistor, the difference current between said mirrored third current and said fourth current being the other of said complementary drive signals, the collector-emitter circuits of said fifth and seventh transistors connected in series between the inputs of said first and second current mirrors and the collector-emitter circuits of said sixth and eighth transistors connected in series between the outputs of said first and second current mirrors, and a resistor connected between the junction of said fifth and seventh transistors and the junction of said sixth and eighth transistors.

11. The output stage of claim 8, wherein said drive circuit is arranged to receive a differential voltage across first and second inputs and to conduct said complementary drive signals through respective current paths, the magnitude of said complementary drive signals varying with said differential voltage, further comprising an input stage having at least one input and providing said differential voltage to said first and second inputs, said differential voltage varying with said at least one input, said input stage and said output stage forming an operational amplifier.

12. The output stage of claim 11, wherein said operational amplifier is a current feedback amplifier.

13. The output stage of claim 11, wherein said operational amplifier is a voltage feedback amplifier.

14. The output stage of claim 8, wherein said drive circuit is arranged to receive a single-ended voltage at an output stage input and to conduct said complementary drive signals through respective current paths, the magnitude of said complementary drive signals varying with said single-ended voltage, further comprising an input stage having at least one input and providing said single-ended voltage to said output stage input, said single-ended voltage varying with said at least one input, said input stage and said output stage forming an operational amplifier.

15. The output stage of claim 14, wherein said operational amplifier is a current feedback amplifier.

16. The output stage of claim 14, wherein said operational amplifier is a voltage feedback amplifier.

17. An operational amplifier output stage, comprising:

complementary bipolar output transistors, the collector-emitter circuits of which are connected in series between a first supply voltage and a second supply voltage, the junction between said collector-emitter circuits being said output stage's output terminal, said output transistors connected to conduct respective currents in response to complementary drive signals with the difference current between said respective currents delivered to said output terminal as said output stage's output current, a drive circuit connected to provide said complementary drive signals to the bases of said output transistors, said drive circuit having a given quiescent current which limits the maximum amplitude of said drive signals, said drive circuit comprising:

first and second inputs connected to receive a differential voltage, first and second transistors connected as emitter followers, the bases of which are connected to respective ones of said first and second inputs, third and fourth transistors connected as emitter followers, the bases of which are connected to said first and second inputs, respectively, the polarities of said third and fourth transistors being complementary to those of said first and second transistors, fifth and sixth transistors connected to receive the outputs of said first and second emitter followers, respectively, and to conduct first and second currents in response, the polarities of said fifth and sixth transistors being complernentary to those of said first and second transistors, a first current mirror having an input and an output, said first current mirror connected to mirror said first current to said sixth transistor, the difference current between said mirrored first current and said second current being one of said complementary drive signals, seventh and eighth transistors connected to receive the outputs of said third and fourth emitter followers, respectively, and to conduct third and fourth currents in response, the polarities of said seventh and eighth transistors being complementary to those of said third and fourth transistors, a second current mirror having an input and an output, said second current mirror connected to mirror said third current to said eighth transistor, the difference current between said mirrored third current and said fourth current being the other of said complementary drive signals, the collector-emitter circuits of said fifth and seventh transistors connected in series between the inputs of said first and second current mirrors and the collector-emitter circuits of said sixth and eighth transistors connected in series between the outputs of said first and second current mirrors, and a resistor connected between the junction of said fifth and seventh transistors and the junction of said sixth and eighth transistors, and complementary bipolar clamp transistors biased with respective bias voltages, the collectors of said clamp transistors connected to the bases of their opposing output transistors such that each provides an additional base drive path for the output transistor to which its collector is connected, said additional base drive paths reducing the amplitudes of the drive signals needed from said drive circuit for a given output current and thereby increasing the maximum output current available from said output stage for said given quiescent current.

18. The output stage of claim 17, wherein said first and second current mirrors each have ratios of greater than 1:1.

* * * * *